United States Patent [19]

Sato et al.

[11] Patent Number: 5,418,094
[45] Date of Patent: May 23, 1995

[54] METHOD FOR FORMING A LIGHT SHIELDING PATTERN

[75] Inventors: Morimasa Sato; Masayuki Iwasaski; Fumiaki Shinozaki, all of Shizuoka, Japan

[73] Assignee: Fuji Photo Film Co., Ltd., Kanagawa, Japan

[21] Appl. No.: 992,032

[22] Filed: Dec. 17, 1992

[30] Foreign Application Priority Data

Dec. 17, 1991 [JP] Japan ................................. 3-333337

[51] Int. Cl.$^6$ .............................................. G03F 9/00
[52] U.S. Cl. ......................................... 430/7; 430/20; 430/321; 430/325; 359/67; 359/68
[58] Field of Search ............... 430/325, 7, 20, 321; 359/67, 68

[56] References Cited

U.S. PATENT DOCUMENTS 4,837,097  6/1989  Narang et al. .......................... 430/5

FOREIGN PATENT DOCUMENTS 63-309916  12/1988  Japan .
64-78221   3/1989   Japan .
2-53003    2/1990   Japan .
2-77702    3/1990   Japan .
3-252622   11/1991  Japan ..................................... 430/7

*Primary Examiner*—Charles L. Bowers, Jr.
*Assistant Examiner*—John A. McPherson
*Attorney, Agent, or Firm*—Sughrue, Mion, Zinn, Macpeak & Seas

[57] ABSTRACT

A method for forming a light shielding pattern on a substrate having a picture element pattern on its front including picture elements which have a single color or plural colors and do not contact each other includes.

(1) forming a photopolymerizable light shielding material layer on the front of a substrate having picture element pattern including picture elements having a single color or plural colors, (2) overall exposing from the back of the substrate, (3) exposing the photopolymerizable light shielding material layer through a mask which is light transmissive at portions corresponding to the periphery of the picture elements of the picture element pattern formed on the substrate and at portions at which no picture element is present, (4) developing the photopolymerizable light shielding material to form the light shielding pattern, and (5) subjecting the light shielding pattern formed to a side etching to remove any portion of the light shielding pattern, which overlaps with the picture elements wherein step (2) is carried out after step (1) and before step (5).

16 Claims, No Drawings

METHOD FOR FORMING A LIGHT SHIELDING PATTERN

FIELD OF THE INVENTION

The present invention relates to a method for forming a colored pattern having a light shielding pattern with a high fineness and an excellent flatness. The method according to the present invention is particularly useful for preparing a color filter used for a liquid crystal display.

BACKGROUND OF THE INVENTION

Methods such as a coloring method, a dye dispersion method, a printing method, and a transfer method are available for forming a color filter used for a color liquid crystal display. In any method, the position accuracy of the respective coloring patterns (for example, red, green, blue and black) is very important. Particularly in a light shielding pattern, a so-called black matrix, the position thereof has to be settled without having spaces between the other coloring patterns. Because of that reason, at present the black matrix is formed so that it overlaps with the other coloring patterns to some extent. The black matrix is formed with a Cr vapor deposition layer in some cases, but because of the high cost thereof, it is considered at present to use a light-sensitive resin containing a dye such as carbon black as described in JP-A-63-314501 (the term "JP-A" as used herewith means an unexamined published Japanese patent application) and JP-A-64-35417.

However, this method involves the disadvantage that the formation of a color filter with this method creates micron-sized projections at the portion at which the black matrix and a color picture element overlap, and these projections result in causing an opposition short (short circuit between the opposite electrode substrates) when a liquid crystal panel is prepared therewith.

In order to improve the above matter, there is considered the method in which a light shielding material layer is formed overall on the R, G and B picture elements, and then a selective etching is carried out in a vertical direction to thereby form a light shielding material layer only at the spaces between the R, G and B picture elements, as disclosed in JP-A-2-287404.

In this method, however, etching has a selectivity in a vertical direction, and therefore it necessary to provide a leveling layer such as a photoresist after providing the light shielding layer in order to compensate for the difference in the level in the light shielding layer, which is originated from the differences in R, G and B, and there is involved therein a disadvantage that the number of steps is increased, and it is very difficult to control the etching amount, which results in a liability to generate a pin hole.

JP-A-1-293306 describes a method in which after coating a dye dispersing light-sensitive resin, patternwise exposing and developing, a black resist is coated and an exposure is made from the non-coated side, followed by developing. However, it is not in any way indicated to remove an overlapped portion by side etching as in the present invention. Further, a black matrix having a large light shielding performance with a sufficient accuracy cannot be formed with the method by back exposing described in this specification, since the exposure of a black color light-sensitive resin from the back does not promote curing to a sufficient depth.

JP-A-64-78221 describes a method in which after coating a colored light-sensitive resin on a substrate, patternwise exposing and developing, an exposure is made from the substrate side. Further, JP-A-2-77702 describes a method in which a patternwise exposure is made from both sides of a colored resist coated side and a non-coated side on a transparent substrate. Further, JP-A-2-53003 describes a method in which after coating a dye dispersing light-sensitive resin, patternwise exposing and developing, an overall exposure is made once again without applying a mask.

The application of this method improves the pattern formability, but an overlapping with the R, G and B picture elements can not be removed, and the flatness is insufficient.

SUMMARY OF THE INVENTION

An object of the present invention is to provide a method for readily forming a light shielding pattern having a good flatness, no voids and a high shielding performance in a simple manner. The method according to the present invention is particularly useful for preparing a color filter having an excellent characteristics.

The above object of the present invention has been achieved by a method for forming a light shielding pattern on a substrate having picture element patterns which have a single color or plural colors and do not contact each other, wherein the following steps are included.

One embodiment of the present invention is a method for forming a light shielding pattern on a substrate having a picture element pattern on its front comprising picture elements which have a single color or plural colors and do not contact each other, which includes:

(1) forming a photopolymerizable light shielding material layer on the front of a substrate having a picture element pattern comprising picture elements having a single color or plural colors, (2) overall exposing from the back of the susbtrate, (3) exposing the photopolymerizable light shielding material layer through a mask which is light transmissive at the portions corresponding to the periphery of the picture elements of the picture element pattern formed on the substrate and at portions at which no picture elements is present, (4) developing the photopolymerizable light shielding material layer to form the light shielding pattern, and (5) subjecting the light shielding pattern formed to side etching to remove any portion of the light shielding pattern which overlaps with the picture elements, wherein step (2) is carrid out after step (1) and before step (5).

Another embodiment of the present invention is a method for forming a light shielding pattern on a substrate having a picture element pattern on its front comprising picture elements which have a single color or plural colors and do not contact each other, which includes:

(1) forming a photopolymerizable light shielding material layer on the front of a substrate having picture element patterns comprising picture elements having a single color or plural colors, (2) exposing the photopolymerizable light shielding material layer through a mask which has a light transmissive region corresponding to portions at which the picture elements of the picture element pattern formed on the substrate are not present, (3) developing the photopolymerizable light shielding material layer to form a light shielding pattern which is larger than the light transmissive region of the mask, and (4) subjecting the light shielding pattern formed to side etching to remove any portion of the light shielding pattern which overlaps with the picture elements.

DETAILED DESCRIPTION OF THE INVENTION

The present invention will be explained below in detail.

The method for forming the light shielding pattern according to the present invention is characterized in that by utilizing the fact that in the black photopolymerizable light shielding material used for forming the light shielding pattern, light does not reach sufficiently inside during exposure, and therefore the polymerization degree at a portion farther from a surface is low, after light shielding pattern is formed the portion thereof which overlaps with the color picture element pattern is removed to thereby obtain a multicolor pattern having an excellent flatness.

There are available several methods for forming the pattern having a low polymerization degree at a portion far from a surface.

One is a method in which after a photopolymerizable light shielding layer is formed, a portion of the respective picture elements of the picture element pattern and a portion at which no picture elements are present are exposed on the photopolymerizable light shielding layer through a light transmissive mask to form a light shielding pattern, and then the portion of the light shielding pattern which overlaps with a color picture element is removed, wherein an overall exposure from the back at the step (2) in the above first method may be carried out in any order as long as it is carried out after the step (1) and before the step (5) (for example, step (2) can be carried out before step (3), steps (2) and (3) can be carried out simultaneously, or step (2) can be carried out after step (3); also, step (2) can be carried out between steps (4) and (5)). However, if the step (2) is not carried out, the light shielding material layer on the substrate is insufficiently cured and therefore it is attacked by a processing solution at the step (5) to generate voids, which result in lowering a light shielding performance. As another embodiment of this method, steps (4) and (5) can be carried out sumultaneously.

A second one is a method in which only a portion which the respective picture elements of a picture element pattern are not substantially present is exposed on a photopolymerizable light shielding material via a light transmissive mask so that a light shielding pattern which is formed after developing becomes larger than a light transmission region of the mask used to thereby prepare the light shielding pattern and then the portion of the light shielding pattern which overlaps with the color picture element is removed. In one particular embodiment, steps (3) and (4) of the above second method can be carried out simultaneously.

Such exposure can be carried out by methods such as making an exposure excessive and having a slight gap between a photopolymerizable light shielding layer and a mask without tightly contacting them.

In this second method, the polymerization degree at the portion of the light shielding pattern which overlaps with the color picture elements is low compared with that in the first method and it becomes possible to remove it with a weaker processing solution than that used in the first method. Accordingly, while an exposure from the back is not essential, a light shielding pattern having fewer defects can be formed by an exposure from the back.

In the present invention, the procedure for removing the portion of the light shielding material pattern which overlaps with the color picture elements is called "side etching".

There are available various methods for carrying out the side etching, such as carrying out the processing with a solution having a composition different from that of the developing solution after developing the light shielding material layer and extending the developing time necessary for forming a usual pattern.

In these procedures, it is effective as well to apply the processing solution by rubbing with a brush.

Next, the method for forming a multicolor pattern with the present invention will be explained.

First, the red (R), green (G) and blue (B) picture element patterns are formed on a transparent glass substrate. Any of a coloring method a printing method, an electrodeposition method, an electrodeposition transfer method, a transfer method, and a pigment dispersion method can be applied as a forming method. Next, a photopolymerizable light shielding material layer is provided overall thereon. A pigment dispersion method or a transfer method, and a printing method such as a screen printing method in some cases, can be used as the method therefor.

Further, in order to prevent the generation of pin holes, an overall exposure is given from the back to cure a part (a vicinity of the surface on the side closer to the light source) of the light shielding material layer between the R, G and B picture elements, and then a pattern exposure is given from a front side via a photomask which is designed so that the light shielding material layer remains in the vicinity of the R, G and B picture elements partly superposing and the spaces between the R, G and B picture elements are fully filled up without gaps. Then, the unnecessary portion of the light shielding material layer is removed by a development processing to thereby convert the light shielding material layer to the pattern.

In the above procedure, projections of several $\mu m$ are formed because of an overlapping part existing between the respective R, G and B picture elements and light shielding part. In the light shielding material layer, however, because of a low light transmission, a photopolymerization usually takes place only on the surface thereof, and the lower part is scarcely photopolymerized.

Accordingly, either a further extension of the development processing or processing with a solution having a different composition from that of the developing solution leads to subjecting the light shielding part of an overlapping portion to side etching, and finally the projections on the overlapping portion are removed.

The photopolymerizable light shielding material according to the present invention may be prepared by dispersing or dissolving carbon black, a black pigment, a black mixture consisting of the combination of plural color pigments which may include carbon black and/or a black pigment, or a black dye, in a photopolymerizable composition. The photopolymerizable light shielding material in which carbon black, a black pigment or a pigment mixture is dispersed is better in terms of providing a light shielding layer with excellent heat resistance and light fastness.

As a photopolymerizable resin composition, one capable of being developed with an alkaline aqueous solution and the one capable of being developed with an organic solvent are available. Of them, the one capable of being developed with an alkaline aqueous solution is preferred in terms of safety and cost of the developing solution. The one capable of being developed with an alkaline aqueous solution contains a binder having a carboxylic acid group, a polyfunctional acrylic monomer and a photopolymerization initiator as the main components.

The preferred photopolymerizable light shielding material, which is described in JP-A-1-152449, is the composition containing as the pigment, carbon, titanium carbon and iron oxide singly or in a mixture thereof; as the polyfunctional acrylic monomer, methacrylates such as ethylene glycol methacrylate, triethylene glycol dimethacrylate, 1,3-butanediol dimethacrylate, tetramethylene glycol dimethacrylate, propylene glycol dimethacrylate, trimethylolpropane trimethacrylate, 1,4-hexanediol dimethacrylate, pentaerythritol tetramethacrylate, and dipentaerythritol hexamethacrylate; as the binder having a carboxylic acid group, a copolymer of an unsaturated organic acid compound such as acrylic acid and methacrylic acid and an unsaturated organic acid ester compound such as methyl acrylate, ethyl acrylate and benzyl methacrylate; and as the photopolymerization initiator, a halomethyl oxadiazole series compound or a halomethyl-s-triazine series compound. The preferred contents of the respective components in terms of % by weight based on the total solids content are about 10 to about 50% for the pigment, about 10 to about 50% for the polyfunctional acrylate monomer, about 20 to about 60% for the binder having a carboxylic acid group, and about 1 to about 20% for the photopolymerization initiator. However, the photopolymerizable composition capable of being used for the present invention is not limited thereto and can suitably be selected from the publicly known ones.

As the method for forming the photopolymerizable light shielding material layer on the aggregate of the picture elements usually consisting of the R, G and B picture elements on a glass substrate, publicly known methods such as a method in which a solution of the above photopolymerizable composition is coated with a coater such as a spin coater or a roll coater and dried, a method with screen printing, and a method in which a photopolymerizable light shielding material layer formed by coating on a different temporary support and drying is transferred and laminated with a laminator are available, and the photopolymerizable light shielding material layer can be formed with these publicly known methods. Further, an oxygen shielding layer which is soluble in a developing solution or water, such as polyvinyl alcohol, may be provided on the photopolymerizable light shielding layer.

Of these methods, the method involving laminating by transfer, which has simplified steps and by which the stable performance can be obtained, is preferred. In this method, an intermediate layer having a good peeling performance from a temporary support can be provided between the light shielding material layer and the temporary support. This intermediate layer preferably consists of a material having a small oxygen permeation in order to increase the photopolymerization performance of the light shielding material layer.

In the method for forming the light shielding pattern according to the present invention, an even exposure is given to an area including a region occupied by the R, G and B picture elements at an exposing step from the back after forming a photopolymerizable light shielding material layer. The maximum exposure is selected so that the photopolymerizable light shielding material layer portion opposite to an exposed face of the R, G and B picture elements is not insolubilized in the developing solution by a part of light transmitting through those picture elements. When it is not desired that the light shielding material layer is insolubilized in a region in which the R, G and B picture elements do not exist, an exposure from a back can be carried out through a photomask masking the portion.

It is important to provide a minimum exposure in exposing from the back so that a photopolymerizable light shielding material layer exposed from the back remains on a transparent substrate at least when it is processed in a developing solution. In exposing from the back, an exposure can be given under a non-oxygen atmosphere such as a vacuum, nitrogen gas and argon gas, and heating can be applied in, during or after the exposure. As the light used for exposing, light of ultraviolet to visible regions can be used. Conventional lamps such as an ultra high voltage mercury lamp, a xenon lamp, a carbon arch lamp, and an argon laser can be used to provide the light.

In the method according to the present invention, a pattern exposure of a photopolymerizable light shielding material layer after a back exposure may be given immediately after the back exposure or some time later. Considering productivity, it is given preferably immediately thereafter or several hours later. An exposure is not specifically limited. Too much thereof badly affects the resolution of an image and the following side etching performance, and therefore an optimum exposure is desirably selected. The same ones as described in the above back exposure can be applied as well for the light source and atmosphere in the pattern exposure. The width of the overlapped portion of the pattern of the light shielding layer and the pattern of the R, G and B picture elements is preferably about 0.5 to about 10 μm. A width less than about 0.5 μm lowers productivity, since time is consumed for adjusting the position of a mask, and a width exceeding about 10 μm is not preferable, since side etching performance is deteriorated.

In the method according to the present invention, the developing solution is preferably an alkaline aqueous solution or a solution prepared by mixing an organic solvent with an alkaline material. Suitable alkaline materials are alkaline metal hydroxides (for example, sodium hydroxide and potassium hydroxide), alkaline metal carbonates (for example, sodium carbonate and potassium carbonate), alkaline metal bicarbonates (for example, sodium bicarbonate and potassium bicarbonate), alkaline metal silicates (for example, sodium silicate and potassium silicate), alkaline metal metasilicates (for example, sodium metasilicate and potassium metasilicate), triethanolamine, diethanolamine, monoethanolamine, morpholine, tetralkylammonium hydroxides (for example, tetramethylammonium hydroxide), or tri-sodium phosphate. A suitable organic solvent which is miscible with water is methanol, ethanol, 2-propanol, 1-propanol, butanol, diacetonealcohol, ethylene glycol monomethyl ether, ethylene glycol monoethyl ether, ethylene glycol mono-n-butyl ether, benzyl alcohol, acetone, methyl ethyl ketone, cyclohexanone, ϵ- caprolactone, γ-butylolactone, dimethylformamide, dimethylacetamide, hexamethylphosphoramide, ethyl lactate, methyl lactate, ε-caprolactam, or N-metylpyrrolidone. A publicly known surface active agent can be added to the developing solution. The developing solution can be used in the form of either a bath solution or a spraying solution. In order to remove the non-cured portion of the photopolymerizable light shielding material layer, methods such as rubbing with a rotary brush and rubbing with a wet sponge can be combined. Usually, the temperature of the developing solution is preferably from a room temperature to 40° C. It is possible that the development processing is followed by a rinsing step.

The method for removing the portion of the light shielding pattern which overlaps with the R, G and B picture elements may be carried out simultaneously with the above developing step or as the step after developing.

As already described above, side etching is used to dissolve and remove the portion of the photopolymerizable light shielding material layer subjected to a pattern exposure which overlaps the color picture elements by utilizing the insufficient curing in the vicinity of the portion at which the light shielding material and picture elements are contacted. Accordingly, the solution used in the side etching step may be fundamentally the same as the above developing solution, but a solution having a little lower dissolving power is preferably used. The dissolving power can be adjusted by adjusting the concentration of the alkaline material, the concentration of the organic solvent miscible with water, and the concentration of the surface active agent. The side etching can be carried out in the same manner as described at the developing step; a substrate to be subjected to the side etching may be dipped in a bath containing the processing solution, it may have the processing solution sprayed thereon, or the side etching can be favorably carried out by rubbing the substrate with a rotating brush or a sponge.

This processing can give a multicolor pattern with an excellent flatness including a light shielding pattern.

EXAMPLES

The present invention will be explained below in detail with reference to the following examples, which should not be construed as limiting the present invention in any way. All parts, percents, ratios and the like are by weight, unless stated otherwise.

EXAMPLE 1

A coating solution consisting of the following composition H1 was coated on a polyethylene terephthalate temporary support with a thickness of 100 μm and dried, whereby a thermoplastic resin layer with a dry thickness of 20 μm was provided.

| Composition H1 for the thermoplastic resin layer: | |
|---|---|
| Vinyl chloride/vinyl acetate copolymer (weight ratio: vinyl chloride/vinyl acetate = 75/25, polymerization degree: about 400, MRP-TSL manufactured by Nissin Chemical Co., Ltd.) | 290.0 g |
| Vinyl chloride-vinyl acetate-maleic acid copolymer (weight ratio: vinyl chloride/vinyl acetate/maleic acid = 86/13/1, polymerization degree: about 400, MRP-TM manufactured by Nissin | 76.0 g |

| -continued | |
|---|---|
| Composition H1 for the thermoplastic resin layer: | |
| Chemical Co., Ltd.) | |
| Dibutyl phthalate | 88.5 g |
| Fluorine series surface active agent (F-177P manufactured by Dainippon Ink & Chemicals, Inc.) | 5.4 g |
| MEK | 975.0 g |

Next, a coating solution consisting of the following composition B1 was coated on the above thermoplastic resin layer and dried, whereby a separating layer with a dry thickness of 1.6 μm was provided.

| Composition B1 for the separating layer: | |
|---|---|
| Polyvinyl alcohol (PVA 205 manufactured by Kuraray, saponification rate = 80%) | 173.2 g |
| Fluorine series surface active agent (SURFLON S131 manufactured by Asahi Glass Company, Ltd.) | 8 g |
| Distilled water | 2800 g |

Four color light-sensitive solutions of a black color (for a Bl layer), a red color (for an R layer), a green color (for a G layer), and a blue color (for a B layer) each having the composition shown in Table 1 were coated on four sheets of the temporary support having the above thermoplastic resin layer and separating layer, respectively, and dried, whereby a colored light-sensitive resin layer with a dry thickness of 2 μm was provided.

TABLE 1

Composition of the coating solutions for the colored light-sensitive layers

| | Layer | | | |
|---|---|---|---|---|
| | R | B | G | Bl |
| Benzyl methacrylate/methacrylic acid copolymer (mole ratio = 73/27, viscosity = 0.12) | 60 g | 60 g | 60 g | 60 g |
| Pentaerythritol tetracrylate | 43.2 | 43.2 | 43.2 | 43.2 |
| Michler's ketone | 2.4 | 2.4 | 2.4 | 2.4 |
| 2-(o-chlorophenyl)-4,5-diphenylimidazole dimer | 2.5 | 2.5 | 2.5 | 2.5 |
| Ilugazine Red BRT (red) | 5.4 | — | — | — |
| Sudan Blue (blue) | — | 5.2 | — | — |
| Copper phthalocyanine (green) | — | — | 5.6 | — |
| Carbon black (black) | — | — | — | 5.6 |
| Methyl cellosolve acetate | 560 | 560 | 560 | 560 |
| Methyl ethyl ketone | 280 | 280 | 280 | 280 |

Further, a cover sheet of polypropylene (thickness: 12 μm) was contacted by pressing on the above light-sensitive resin layer, whereby the red, blue, green and black light-sensitive transfer materials were prepared.

These light-sensitive transfer materials were used to prepare a color filter in the following manner.

The cover sheet for the red light-sensitive transfer material was peeled off, and the light-sensitive resin layer face was stuck on a transparent substrate (thickness: 1.1 mm) by pressing (0.8 kg/cm$^2$) and heating (130° C.) with a laminator (VP-11 manufactured by Taisei Laminator Co., Ltd.), followed by peeling off the separating layer from the thermoplastic resin layer at the interface thereof to remove simultaneously the temporary support and thermoplastic resin layer.

Next, an exposure was given, followed by developing to remove the unnecessary portion, whereby a red picture element pattern was formed on a glass substrate.

Subsequently, the green light-sensitive transfer material was stuck on the glass substrate on which the red picture element pattern was formed in the same manner as above, followed by peeling off, exposing and developing, whereby a green picture element pattern was formed.

The same procedure was repeated with the blue light-sensitive transfer material to thereby form the respective patterns of R, G and B on the transparent glass substrate.

Further, a black light-sensitive resin layer was provided overall thereon with the above black light-sensitive transfer material by a transfer method.

In the above procedure, the transfer was carried out at a temperature of 130° C., a pressure of 0.8 kg/cm$^2$ and a transporting speed of 0.2 m/min. In forming the patterns, the development was carried out by dipping in a 1% sodium carbonate aqueous solution at 30° C. for 30 seconds.

Then, an overall exposure was given from the back, and subsequently an exposure was given from the front surface side at 200 mJ/cm$^2$ via a photomask disposed so that the periphery of the R, G and B picture elements and the picture element of the black matrix were superposed on each other by 5 μm.

Next, the development was carried out by spraying a 1% sodium carbonate aqueous solution at 33° C. for 25 seconds, whereby a color filter having a pattern with an overlapping portion was obtained.

Thereafter, rubbing with a sponge made of PVA was subsequently applied with the developing solution for 75 seconds to carry out side etching, whereby a color filter having no overlapped picture elements and no pin holes was obtained.

In the above procedure, the layer thicknesses of the respective R, G and B picture elements were settled at the same level, whereby the flatness of the color filter became ±0.1 μm or less.

Further after that, ITO (a transparent electrode) was mounted to actually prepare a liquid crystal panel, whereby an excellent panel which was free of an opposition short was obtained.

EXAMPLE 2

The picture elements and black light-sensitive resin layer were provided overall on the glass substrate in the same manner as Example 1.

Then, the portion having substantially no R, G and B picture elements was exposed from a front side via a light transmissive mask. The exposure was 400 mJ/cm$^2$.

Thereafter, the same processing as that in Example 1 was applied, whereby a color filter having no pin holes and an excellent flatness similarly to Example 1 was obtained.

Further after that, ITO (a transparent electrode) was mounted to actually prepared a liquid crystal panel, whereby an excellent panel which was free of an opposition short was obtained.

EXAMPLE 3

The same procedure as in Example 1 was repeated but using a 0.5% sodium carbonate aqueous solution in the side etching process. The resulting color filter had a flatness of ±0.05 μm or less.

Further after that, ITO was mounted to prepare a liquid crystal panel. The panel prepared was excellent in that no opposition short occurred.

EXAMPLE 4

The same procedure as in Example 2 was repeated but using a 0.5% sodium carbonate aqueous solution in the side etching process. The resulting color filter had a flatness of ±0.05 μm or less.

Further after that, ITO was mounted to prepare a liquid crystal panel. The panel prepared was excellent in that no opposition short occurred.

COMPARATIVE EXAMPLES 1 AND 2

Light shielding patterns were prepared in the same manner as Examples 1 and 2 except that the side etching was not carried out. In these cases, the projections present at the portion at which the picture elements were superposed were at the level of slightly more than ±1 μm.

This color filter was used to prepare the same liquid crystal panel as that in Example 1 to find that an opposition short was generated.

COMPARATIVE EXAMPLE 3

The black light-sensitive resin layer was similarly laminated on the R, G and B picture elements which were prepared in the same manner as Example 1. The portion having substantially no R, G and B picture elements was exposed from the front side via a light transmissive mask, followed by carrying out the development and side etching in the same manner as Example 1 except that the exposure from the back was not carried out, so that not only the overlapped portion was removed but also the other portions in the light shielding pattern were abraded, and therefore only a light shielding pattern of a low quality having a low optical density and many pin holes was obtained.

COMPARATIVE EXAMPLE 4

The black light-sensitive resin layer was similarly laminated on the R, G and B picture elements which were prepared in the same manner as Example 1. After giving an overall exposure from the back, the development was carried out in a developing solution. A light shielding pattern portion which was not sufficiently cured was subjected to a layer abrasion, and therefore only a light shielding pattern of a low quality having a low optical density and many pin holes was obtained.

It is possible according to the present invention to prepare a color filter with a light shielding pattern having no overlapped picture elements and no pin holes as well as a sufficient light shielding performance by a simple method.

While the invention has been described in detail and with reference to specific embodiments thereof, it will be apparent to one skilled in the art that various changes and modifications can be made therein without departing from the spirit and scope thereof.

What is claimed is:

1. A method for forming a light shielding pattern on a substrate having a picture element pattern on its front comprising picture elements which have a single color or plural colors and do not contact each other, said method comprising in order:

(1) forming a picture element pattern on the front of a substrate, said picture element pattern comprising picture elements having a single color or plural colors, (2) forming a photopolymerizable light shielding material layer on the front of the substrate having a picture element pattern comprising picture elements having a single color or plural colors, (3) exposing the photopolymerizable light shielding material layer through a mask which is light transmissive at portions corresponding to the periphery of the picture elements of the picture element pattern formed on the substrate and at portions at which no picture element is present, (4) developing the photopolymerizable light shielding material layer to form the light shielding pattern, (5) overall exposing from the back of the substrate, and (6) subjecting the light shielding pattern formed to side etching to remove any portion of the light shielding pattern which overlaps with the picture elements, wherein the side etching is carried out with a solution having a lower dissolving power than that of a developing solution used in the developing of the photopolymerizable light shielding material layer.

2. A method for forming a light shielding pattern on a substrate having a picture element pattern on its front comprising picture elements which have a single color or plural colors and do not contact each other, said method comprising:

(A) forming a photopolymerizable light shielding material layer on the front of a substrate having picture element patterns comprising picture elements having a single color or plural colors, (B) exposing the photopolymerizable light shielding material layer through a mask which has a light transmissive region corresponding to portions at which the picture elements of the picture element pattern formed on the substrate are not present, (C) developing the photopolymerizable light shielding material layer to form a light shielding pattern which is larger than the light transmissive region of the mask, and (D) subjecting the light shielding pattern formed to side etching to remove any portion of the light shielding pattern which overlaps with the picture elements.

3. A method of claim 2, wherein the steps (C) and (D) are carried out simultaneously.

4. A method of claim 1, wherein the photopolymerizable light shielding material layer is formed by a layer transfer method.

5. A method of claim 2, wherein the photopolymerizable light shielding material layer is formed by a layer transfer method.

6. A method of claim 1, wherein the photopolymerizable light shielding material layer comprises a photopolymerizable resin composition which is capable of being developed with an alkaline aqueous solution.

7. A method of claim 1, wherein the photopolymerizable light shielding material layer comprises 10 to 50% by weight of pigment, 10 to 50% by weight of a polyfunctional acrylate monomer, 20 to 60% by weight of a binder having a carboxylic acid group, and 1 to 20% by weight of a photopolymerization initiator, based on the total solids content of the photopolymerizable light shielding material layer.

8. A method of claim 1, wherein the light shielding pattern overlaps with the picture elements by 0.5 to 10 $\mu$m at each overlap.

9. A method of claim 1, wherein the developing is carried out with a developing solution at a temperature of from room temperature to 40° C.

10. A method of claim 1, wherein the side etching is carried out by rubbing the substrate with a rotating brush or a sponge.

11. A method of claim 2, wherein the photopolymerizable light shielding material layer comprises a photopolymerizable resin composition which is capable of being developed with an alkaline aqueous solution.

12. A method of claim 2, wherein the photopolymerizable light shielding material layer comprises 10 to 50% by weight of pigment, 10 to 50% by weight of a polyfunctional acrylate monomer, 20 to 60% by weight of a binder having a carboxylic acid group, and 1 to 20% by weight of a photopolymerization initiator, based on the total solids content of the photopolymerizable light shielding material layer.

13. A method of claim 2, wherein the light shielding pattern overlaps with the picture elements by 0.5 to 10 $\mu$m at each overlap.

14. A method of claim 2, wherein the developing is carrried out with a developing solution at a temperature of from room temperature to 40° C.

15. A method of claim 2, wherein the side etching is carried out with a solution having a lower dissolving power than that of a developing solution used in the developing of the photopolymerizable light shielding material layer.

16. A method of claim 2, wherein the side etching is carried out by rubbing the substrate with a rotating brush or sponge.

* * * * *